United States Patent
Hudyma

[11] Patent Number: 6,072,852
[45] Date of Patent: Jun. 6, 2000

[54] HIGH NUMERICAL APERTURE PROJECTION SYSTEM FOR EXTREME ULTRAVIOLET PROJECTION LITHOGRAPHY

[75] Inventor: Russell M. Hudyma, San Ramon, Calif.

[73] Assignee: The Regents of the University of California, Oakland, Calif.

[21] Appl. No.: 09/094,392

[22] Filed: Jun. 9, 1998

[51] Int. Cl.[7] ................................................ G21K 5/00
[52] U.S. Cl. ...................... 378/34; 250/492.2; 359/359; 359/366
[58] Field of Search ................ 378/34; 250/492.2; 359/359, 366

[56] References Cited

U.S. PATENT DOCUMENTS

| | | | |
|---|---|---|---|
| 5,063,586 | 11/1991 | Jewell et al. | 378/34 |
| 5,153,898 | 10/1992 | Suzuki et al. | 378/34 |
| 5,212,588 | 5/1993 | Viswanathan et al. | 359/355 |
| 5,220,590 | 6/1993 | Bruning et al. | 378/34 |
| 5,315,629 | 5/1994 | Jewell et al. | 378/34 |
| 5,353,322 | 10/1994 | Bruning et al. | 378/34 |
| 5,410,434 | 4/1995 | Shafer | 359/858 |
| 5,686,728 | 11/1997 | Shafer | 378/34 |

FOREIGN PATENT DOCUMENTS 0 779 528 A2  11/1996  European Pat. Off. ............ 17/8

OTHER PUBLICATIONS

"Design of reflective relay for soft x–ray lithography" by Rodgers et al.; SPIE vol. 1354, International Lens Design Conference (1990).

"Reflective systems design study for soft x–ray projection lithography" by Jewell et al.; J. Vac. Sci. Technol. B 8 (6) Nov./Dec. 1990.

"Optical system design issues in development of projection camera for EUV lithography" by Jewell; SPIE vol. 2437 May 1995.

"Ring–field EUVL camera with large etendu" by W.C. Sweatt, Sandia National Laboratories, (1996).

*Primary Examiner*—Craig E. Church
*Attorney, Agent, or Firm*—Daryl Grzybicki

[57]  ABSTRACT

An optical system is described that is compatible with extreme ultraviolet radiation and comprises five reflective elements for projecting a mask image onto a substrate. The five optical elements are characterized in order from object to image as concave, convex, concave, convex, and concave mirrors. The optical system is particularly suited for ring field, step and scan lithography methods. The invention uses aspheric mirrors to minimize static distortion and balance the static distortion across the ring field width which effectively minimizes dynamic distortion. The present invention allows for higher device density because the optical system has improved resolution that results from the high numerical aperture, which is at least 0.14.

11 Claims, 4 Drawing Sheets

HIGH NUMERICAL APERTURE PROJECTION SYSTEM FOR EXTREME ULTRAVIOLET PROJECTION LITHOGRAPHY

The United States Government has rights in this invention pursuant to Contract No. W-7405-ENG-48 between the U.S. Department of Energy and the University of California, for the operation of Lawrence Livermore National Laboratory.

BACKGROUND OF THE INVENTION

1. Field of the Invention

This invention is related to an optical projection reduction system for use with short wavelength radiation in photolithography equipment used in the manufacture of semiconductor devices.

2. Background of the Invention

Photolithography is a well known manufacturing process used to create devices upon substrates. The process typically involves exposing a patterned mask to collimated radiation thereby producing patterned radiation, which is passed through an optical reduction system. The reduced patterned radiation or mask image is projected onto a substrate coated with photoresist. Radiation exposure changes the properties of the photoresist, allowing subsequent processing.

Exposure tools used in photolithography have two common methods of projecting a patterned mask onto a substrate: "step and repeat" and "step and scan." The step and repeat method sequentially exposes portions of a substrate to a mask image. The step and repeat optical system has a projection field that is large enough to project the entire mask image onto the substrate. After each image exposure, the substrate is repositioned and the process is repeated.

Figure 1:
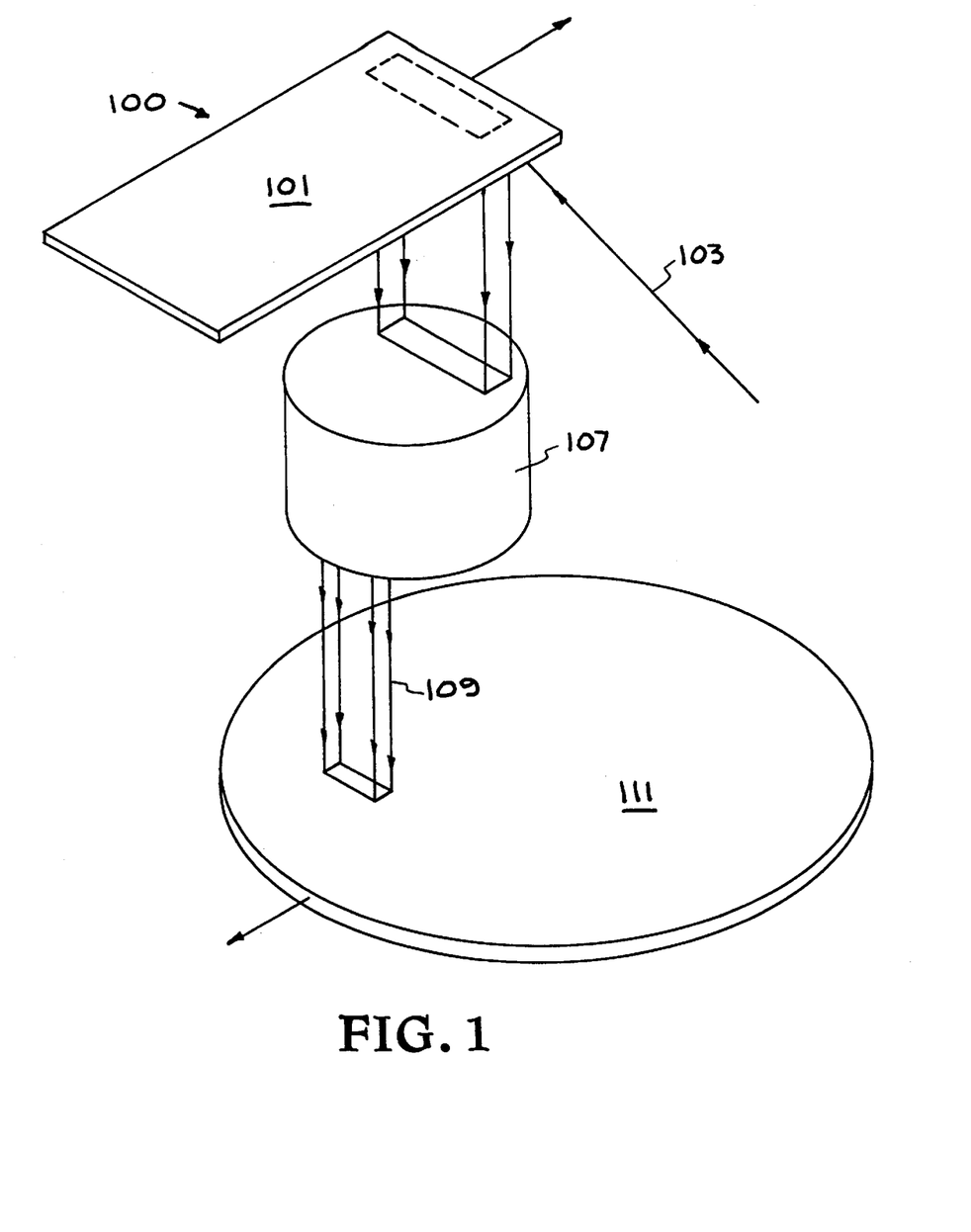
FIG. 1 is a view of a ring field lithography system.

In contrast, the step and scan method scans the mask or reticle onto a wafer substrate over an annular field or a slit field that is the full height of one or more of the chips. Referring to FIG. 1, a ring field lithography system 100 for use in the step and scan method is shown. A moving mask 101 is illuminated by a radiation beam 103, which reflects off the mask 101 and is directed through a reduction ring field optical system 107. Within the optical system 107, the image is inverted and the arcuate shaped ring field 109 is projected onto a moving substrate 111. The arcuate shaped reduced image ring field 109 can only project a portion of the mask 101, thus the reduced image ring field 109 must scan the complete mask 101 onto the substrate 111. Because the mask 101 and substrate 111 move synchronously, a sharp image is scanned onto the substrate 111. Once the complete mask 101 is scanned onto the substrate, the mask 101 and substrate 111 are repositioned and the process is repeated. The dimensions of the slit are typically described by a ring field radius and a ring field width.

As manufacturing methods improve, the minimum resolution dimension or critical dimension (CD) which can be achieved decreases, thereby allowing more electronic components to be fabricated within a given area of a substrate. The number of devices that can be fabricated within an area of substrate is known as device density. For example, a common measure of device density is the amount of memory that can be fabricated on a single DRAM chip. As resolution dimension or CD decreases, DRAM memory size increases dramatically. With existing technology, 0.25 $\mu$m resolution is possible.

One well-known means of improving the resolution dimension and increasing device density is to use shorter exposure wavelength radiation during photolithography processes. The relationship between resolution dimension and radiation wavelength is described in the formula: $R=(K_1\lambda)/(NA)$, wherein R is the resolution dimension, $K_1$ is a process dependent constant (typically 0.7), $\lambda$ is the wavelength of the radiation, and NA is the numerical aperture of the optical system projecting the mask image. Either reducing the wavelength or increasing the NA will improve the resolution of the system.

Improving the resolution by increasing the numerical aperture (NA) has several drawbacks. The most prevalent drawback is the concomitant loss of depth of focus with increased NA. The relationship between NA and depth of focus is described in the formula: $DOF=(K_2\lambda)/NA^2$, wherein DOF is depth of focus, and $K_2$ is a process dependent constant (typically close to unity). This simple relationship shows the inverse relationship between DOF and NA. For several reasons, including practical wafer flatness and scanning stage errors, a large depth of focus is on the order of ±1.0 micrometers is desirable.

Immediately, the shortcomings of resolution improvement via numerical aperture increase can be seen. As lithography technologies evolve toward shorter wavelengths, projection systems operate in different regions of wavelength-NA space. For EUV lithography at an operational wavelength of 13.4 nm, 0.1 $\mu$m resolution can be achieved with a projection system that has a numerical aperture of 0.10 (assuming $K_1$=0.7). A depth of focus of at least ±1.0 $\mu$m results from this low numerical aperture. This large depth of focus will enhance the robustness of a particular lithographic process. In contrast, deep ultraviolet (DUV) lithography at a wavelength, 1, of 193 nm requires a projection system with a numerical aperture of 0.75 to achieve 0.18 $\mu$m features (assuming $K_1$=0.7). At this NA, the depth of focus has been reduced to ±0.34 $\mu$m. This reduction in depth of focus leads to a loss in available process window, which will adversely impact process yield. As the process shrinks, it becomes more difficult to maintain the CD control that is critical to the lithographic process.

As is known in the art, short l radiation (less than about 193 nm) is not compatible with many refractive lens materials due to the intrinsic bulk absorption. To reduce the radiation absorption within an optical system, reflective elements may be used in place of refractive optical elements. State of the art DUV systems use catadioptric optical systems that utilize a combination of refractive and reflective optical elements. Since the mirrors provide the bulk of the optical power, the use of refractive lens elements is minimized To produce devices with smaller critical dimensions and higher device density than is possible with DUV systems, optical systems compatible with even shorter wavelength radiation are required. Extreme ultraviolet (EUV) radiation (l less than about 20 nm) offers the potential to reduce the critical dimension from the current state of the art of 0.18 mm to below 0.05 mm. This radiation cannot be focused refractively. However, EUV radiation can be focused reflectively using optical elements with near normal incidence multilayer coatings.

Early development of optical systems for EUV projection lithography concentrated on projection of two-dimensional (2D) image formats at low numerical apertures. One example of a step and repeat optical system is disclosed in U.S. Pat. No. 5,063,586. The '586 patent discloses coaxial and tilted/decentered configurations with aspheric mirrors that project approximately a 10 mm×10 mm image field. The '586 patent system achieves an resolution of approximately 0.25 μm across this field, but suffers from unacceptably high distortion, on the order of 0.8 μm. The optical system described by the '586 patent is impractical because the mask would have to pre-distorted in order to compensate for the distortion in the projection optics.

Figure 2:
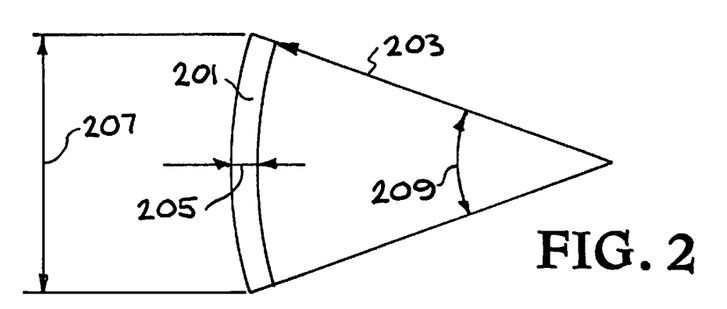
FIG. 2 is a view of a ring field slit.

More advanced optical systems for EUV projection lithography evolved using the step and scan image partitioning method in response to the unacceptable distortion found in the large format step and repeat optical systems. Step and scan systems have inherently less distortion than step and repeat systems due to the reduced field size in the scan dimension. The distortion can be readily corrected to acceptable levels over the field in the scan dimension. Step and scan optical systems typically utilize ring fields. Referring to FIG. 2, in a step and scan optical system an image is projected by the optical system onto the wafer through an arcuate ring field slit 201 which is geometrically described by a ring field radius 203, a ring field width 205 and a length 207. Ring field coverage is limited to 180$_i$ in azimuth.

One example of a step and scan optical system is disclosed in U.S. Pat. No. 5,315,629. Although the '629 patent optical system has low distortion, it does so at the expense of ring field width. The ring field slit width is only 0.5 mm at the wafer. High chief ray angles at mirror M1 make it difficult to widen the ring field width at a usable numerical aperture. The 0.5 mm ring field width of the '629 patent limits the speed at which the wafer can be scanned, restricting throughput. The ring field radius of the optical system described in the '629 patent is 31.5 mm, which limits the field width in the cross scan dimension. Like the '586 patent, the '629 patent is best suited for critical dimensions on the order of 0.1 mm. The numerical aperture of the optical system in the '629 can be scaled up to achieve higher resolution. However, the ability to control distortion is lost as the numerical aperture is scaled to larger values.

Another example of a step and scan optical system is U.S. Pat. No. 5,353,322. The '322 patent discloses 3-mirror and 4-mirror optical systems for EUV projection lithography. An optical system with an odd number of reflections necessitates that the mask and wafer be located on the same side of the optical system. Thus, the motion of the stages that carry the mask and wafer are limited. An extra fold mirror added to the 3-mirror embodiment found in the '322 patent creates a 4-mirror system that enables unlimited stage travel since the wafer and mask are now on opposite sides of the optical system. However, this extra fold mirror does not provide any optical power and thus provides no aberration correction. The principle drawback of the '322 optical system is that its aperture stop is physically inaccessible. Although the stop location allows for a numerical aperture of up to 0.125, the projected imagery could vary substantially across the ring field as the various hard apertures vignette light diffracted by the mask features in the optical system. This is due to the fact that these systems have no physically accessible hard aperture stop to define the imaging bundles from each field point in a like manner. If this vignetting is field dependent, it can lead to loss of CD control across the projected ring field.

Clearly, state of the art optical systems for EUV projection lithography can be used to resolve features sizes that are on the order of 0.1 mm (100 nm). As demonstrated, these systems are coaxial 3- and 4-mirror reflective anastigmats that are optimized to operate over a narrow ring field. Since it is difficult to control both the field and pupil dependence of the aberrations simultaneously, the numerical aperture of these systems is necessarily restricted to approximately 0.10 for ring field of any substantial width (0.5 mm to 1.5 mm).

Prior art offers no concrete examples of multi-mirror systems that achieve higher NAs (>0.15) with low static distortion (<CD/10). Examples of optical systems for EUV projection lithography with numerical apertures in excess of 0.10 are disclosed in U.S. Pat. No. 5,212,588. The '588 patent demonstrates a multi-bounce projection system that incorporates 2 coaxial aspheric mirrors in a 4-bounce configuration. Mirror M1 is convex and mirror M2 is concave. Both mirrors have substantially the same radius of curvature to obtain a near zero Petzval sum. This ensures that high resolution imagery will be obtained on a flat imaging surface. While the '588 patent describes a number of embodiments with excellent performance over a range of numerical aperture up to 0.17 at EUV wavelengths, all the systems suffer one common flaw: the exit pupil is centrally obscured by mirror M1. This central obscuration suppresses the MTF response of the system at the mid-spatial frequencies relative to the cut-off frequency. Since the obscuration is large (on the order of 40%), this loss of contrast will yield unacceptable lithographic imaging performance.

One path to higher resolution is to add an extra mirrored surface in such a manner as to enhance the simultaneous correction of both the field and pupil dependence of the aberrations. An examples of a 5-mirror EUV projection system is disclosed in U.S. Pat. No. 5,153,898. However, only three of the mirrored surfaces provide aberration correction, and the extra two mirrors only act to fold or redirect the incoming radiation. The '898 patent does not enable high numerical optical systems for EUV projection lithography.

In view of the foregoing, there is a need for an optimized optical system which is compatible with short wavelength radiation and has a high numerical aperture for improved resolution.

SUMMARY OF THE INVENTION

The present invention is directed to a five mirror reflective optical projection system that allows a reduced mask image to be projected onto a wafer with short wavelength radiation. The present invention allows for higher device density because the optical system has improved resolution that results from the high numerical aperture, which is at least 0.14. An inventive optical system having a numerical aperture of 0.18 with extreme ultraviolet radiation of approximately 13.1 nm, and assuming a process dependent constant $k_1$ of 0.7, yields a resolution on the order of 50 nm.

The present invention also includes a physically accessible aperture stop which allows the imagery to be stationary across the ring field. This aperture stop is imaged to infinity in image space, making the imaging bundles telecentric at the mask. This ensures that the local magnification remains constant as the image plane is moved through the depth of focus of the projection system.

All five mirrors of the inventive optical system are aspheric. The aspheric surfaces provide enough degrees of freedom to enable the correction of both astigmatism and distortion across the ring field format. This high level of optical correction allows diffraction-limited performance at a numerical aperture greater than about 0.14, with the distortion being reduced to less than one-tenth of the critical dimension (CD) at any point in the ring field.

Other advantages and features of the present invention will become apparent from a reading of the following description when considered in conjunction with the accompanying drawings.

DESCRIPTION OF THE PREFERRED EMBODIMENT

The following is a detailed description of the presently preferred embodiments of the present invention. However, the present invention is in no way intended to be limited to the embodiments discussed below or shown in the drawings. Rather, the description and the drawings are merely illustrative of the presently preferred embodiments of the invention.

Figure 3:
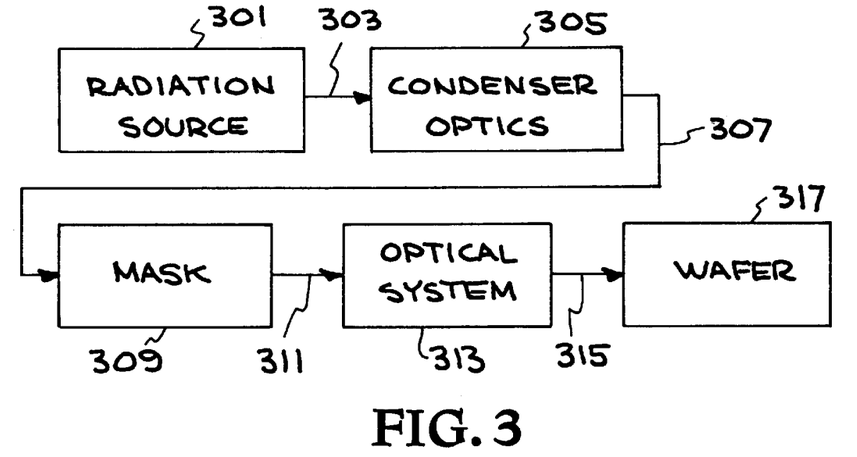
FIG. 3 is a schematic depiction of the main elements of the exemplary EUV lithography apparatus according to the present invention.

The present invention is a photolithography optical system designed for use with extreme ultraviolet (EUV) radiation. FIG. 3 schematically depicts the exemplary inventive apparatus for semiconductor EUV lithography. The apparatus comprises a radiation source 301 that emits EUV radiation 303. The EUV radiation 303 may be processed by a condenser 305 to produce a EUV beam 307 to uniformly illuminate a portion of a mask 309. The radiation reflected from the mask 309 produces a patterned EUV beam 311, which is introduced into an optical system 313. The optical system 313 projects a reduced image 315 of the mask 309 onto a wafer 317.

EUV radiation has a wavelength ($\lambda$) between about 4 to 20 nm and may be produced by any suitable means including a laser produced plasma, synchrotron radiation, electric discharge sources, high-harmonic generation with femtosecond laser pulses, discharge-pumped x-ray lasers, and electron-beam driven radiation devices. Laser-produced plasma (LPP) sources focus an intense pulsed laser beam onto a target. Suitable targets are metals and noble gases. Targets of noble gas molecule clusters in a supersonic jet produce a bright "spark" with a broad emission spectrum ranging from visible light to EUV radiation. High-repetition-rate (3,000–6,000 Hz) pulsed laser drivers deliver 1,500 W of focused power to the target regions. A LLP gas source converts the incident laser power into EUV light in the required spectral bandwidth.

Condenser optics typically collect EUV radiation from the LLP source and condition the radiation to uniformly illuminate the mask. The condenser illuminates a narrow ring field at the mask with the EUV radiation, the illumination having a spatial nonuniformity of less than 1% in the cross scan dimension. The condenser further directs the EUV beam into the entrance pupil of the optical system with a partial coherence of approximately 0.7. Separate collection channels each act in concert to direct radiation across the entire ring field and the optical system entrance pupil.

Since EUV radiation is absorbed by all materials, reflective optical elements are best suited for EUV optical systems. The inventive optical system comprises five reflective optical elements (mirrors) listed in order from mask to substrate: M1, M2, M3, M4, and M5. The optical system is placed in a vacuum or other suitable atmosphere.

Figure 4:
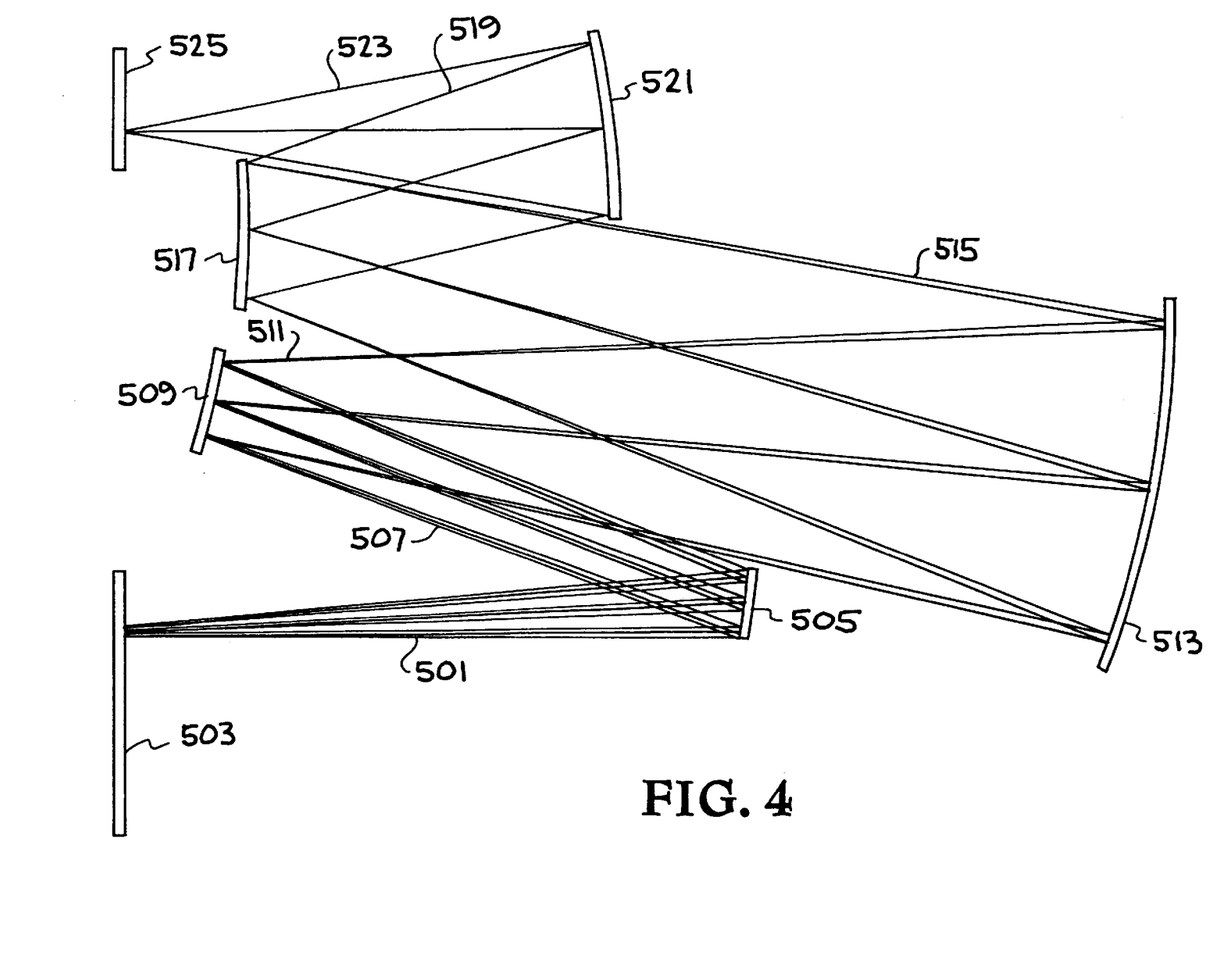
FIG. 4 is a view of the optical system according to the present invention.

In the lithographic process, the EUV radiation is collected and illuminates a mask, producing an object that can be projected to the wafer. The object end of the inventive optical system departs enough from the telecentric condition so that the light rays incident upon the reflective mask have sufficient clearance to prevent vignetting or clipping by mirror edges. Referring to FIG. 4, there is shown an exemplary optical system for EUV semiconductor lithography. Because this is a ring field optical configuration, only off-axis sections of the parent mirrors are used. Thus, the off-axis section of the first optical element (M1) 505, the off-axis section of the second optical element (M2) 509, the off-axis section of the third optical element (M3) 513, and the off-axis section of the fifth optical element (M5) 521 are exposed to EUV radiation. The entire aspheric parent of the fourth optical element (M4) 517 is used. The use of off-axis sections, rather than full parent mirrors, facilitates the multilayer coating process by allowing the use substantially small deposition chambers, thus ensuring that very uniform coatings can be applied. Although off-axis mirror sections are used in practice, the optical elements are all arranged in a coaxial configuration such that the vertex of each surface of revolution lies on a common mechanical centerline.

Referring to FIG. 4, EUV Beam 1 501 diverges from a reflective mask 503 onto concave aspheric mirror 505. Beam 2 507 is reflected from mirror 505 in a divergent cone to a convex aspheric mirror M2 509. Beam 3 511 is reflected from mirror M2 509 in a divergent cone to a concave aspherical mirror M3 513. Beam 4 515 is reflected from mirror M3 513 in a convergent cone to a convex aspheric mirror M4 517, which also functions as the aperture stop of the system. Beam 5 519 is reflected from mirror M4 517 in a divergent cone to a concave aspheric mirror M5 521. Beam 6 523 is reflected from mirror M5 521 in a convergent cone forming a reduced image of the mask 503 pattern onto a wafer 525. The projected EUV aerial image enables a chemical reaction in a photoresist layer on the wafer 525 forming the latent image in the photoresist. This latent image is then subsequently processed by well-known means to form the patterned wafer.

Concave mirrors have positive optical power and convex mirrors have negative optical power. Using this convention, the optical power configuration of the inventive system from object to image can be described as: positive, negative, positive, negative and positive, corresponding to mirrors M1 505, M2 509, M3 513, M4 517, and M5 521, respectively. This grouping of separated positive and negative optical power allows the optical system to achieve a Petzval sum that is substantially zeroed, while enabling correction of both astigmatism and distortion.

Since the focal length of the inventive optical system can be scaled to accommodate a variety of packaging concepts, it is useful to describe the inventive optical system relative to this quantity. The absolute radii of the mirrors $M_1$ 505, $M_2$ 509, $M_3$ 513, $M_4$ 517, and $M_5$ 521, relative to the system focal length, are listed in Table 1 below. The relative positions of the mirrors M1 505, M2 509, M3 513, M4 517, and M5 521 are listed in Table 2 below. For a 4-to-1 reduction, the distance of the mask to M1 505 is 744.35 mm.

TABLE 1

| Mirror | Mirror radii from object plane to image plane as a fraction of the system focal length ±5% |
|---|---|
| $M_1$ | −1.1962 |
| $M_2$ | −0.3911 |
| $M_3$ | −0.7092 |
| $M_4$ | −0.4196 |
| $M_5$ | −0.3671 |

TABLE 2

| Surface | Axial separations of the mirrors as a fraction of the system focal length ±10% |
|---|---|
| $M_1$ to $M_2$ | −0.2738 |
| $M_2$ to $M_3$ | −0.4727 |
| $M_3$ to $M_4$ | −0.4649 |
| $M_4$ to $M_4$ | −0.1813 |
| $M_5$ to image | −0.2441 |

Multilayer coated EUV optical systems require that the EUV radiation have low angles of incidence at each of the mirror surfaces. EUV multilayers are constructed using alternating layers of two materials with different optical properties. These materials need to have low intrinsic absorption at EUV wavelengths and provide an optical impedance mismatch at the layer interface so that a reflected wave can be generated. Common material pairs with desirable characteristics include molybdenum/silicon (Mo/Si) for wavelengths near 13.4 nm and molybdenum/beryllium (Mo/Be) for near wavelengths near 11.3 nm. Since the optical impedance between these material pairs is low, the bandwidth of the spectral reflectivity about the peak reflectivity is relatively small. This narrow bandwidth means that the multilayer reflectivity will, for a fixed angle of incidence, be sensitive to shifts in wavelength. Shifts in radiation wavelength are equivalent to changes in the incidence angle in the sense that both factors shift multilayer performance away from its optimum resonance condition. For a fixed wavelength, the multilayer reflectivity will degrade as a function of incidence angle.

The high system transmission is a key feature of this inventive optical system, which is achieved by using shallow incidence angles on each of the mirrored surfaces. Keeping the mean angle of incidence low at each surface ensures that the optical system transmission, which described by the formula $T_{sys}=R_1 \times R_2 \times R_3 \times R_4$, where Ri represents the reflectivity of the $i^{th}$ mirror, will be maximized for a range of incident angles and range of wavelengths. Low angles of incidence also helps to ensure that multilayer amplitude and phase effects measured in the exit pupil of the projection system are minimized. These amplitude and phase effects could substantially alter the partially coherent imaging characteristic of the system, thus limiting robust lithographic performance.

Table 3 shows the mean angle of incidence at each mirror surface. Multilayer coatings that have either a uniform or graded thickness can be designed and applied to each of the mirror surfaces in such a manner as to maximize the transmission of this inventive five mirror system. The transmission of the projection optics is greater than 17%, considering that the maximum theoretical reflectivity for a Mo/Si multilayer at 13.4 nm is over 70%.

TABLE 3

| Mirror | Average Angle of Incidence |
|---|---|
| M1 | 11.34° |
| M2 | 7.72° |
| M3 | 5.28° |
| M4 | 15.52° |
| M5 | 7.76° |

Table 4 shows the maximum aspheric departure from a best-fit spherical surface centered on the off-axis section of the parent asphere for each mirror. The inventive optical system is designed using mirrors with low aspheric departure across the off-axis section of the parent to facilitate mirror metrology using visible wavelengths. If the projection system can be designed so that the aspheric departure is small relative to a visible wavelength, the off-axis sections can be tested at their center of curvature without the need for null optics that adversely impact the absolute accuracy of the metrology test. The aspheric departure of prior art systems typically is limited to a maximum of 12 mm. However, a natural consequence of the increased numerical aperture in the present invention is the increased beam footprint on each of the mirror surfaces. The aspheric departure across a mirror surface will increase as the beam footprint is increased.

TABLE 4

| Mirror | Maximum aspheric departure |
|---|---|
| $M_1$ | <5.1 m |
| $M_2$ | <8.5 m |
| $M_3$ | <3.5 m |
| $M_4$ | <0.1 m |
| $M_5$ | <18.8 m |

Another advantage of the inventive optical system is that the design has a physically accessible, real aperture stop on mirror M4. More specifically, this physical aperture stop ensures that imaging bundles from each field point within the ring field are not clipped or vignetted and are formed in the small manner. This makes the projected imagery, setting aside the effects of the field dependent aberrations and variations in illumination from the condenser across the ring field, independent of position within the ring field. Fundamentally this means that the aerial images from different field points in the ring field will look the same and that variations in projected feature size will be minimized. Such imagery is termed stationary imagery.

The larger arcuate slit dimensions of the inventive optical system also help to increase wafer throughput. Prior art optical systems typically produce an arcuate slit with a ring field width of less than about 1.0 mm. The ring field width of the present invention is 1.5 mm, which is significantly wider than that of the prior art. The present invention improves the unit area coverage within a single field on the wafer because the ring field width of the present invention is larger than that of the prior art. This means that more area on the photoresist-coated wafer may be exposed per unit time. Since more area per unit time can be exposed, the lithographic tool can process more wafers per hour. Thus, the inventive optical system can expose a substrate to radiation more efficiently than an optical system with a narrow ring field width.

Tables 5 to 7 contain constructional data and other relevant information for the currently preferred configuration of mirrors M1, M2, M3, M4, and M5. The inventive optical system has a 4:1 reduction ratio, a numerical aperture of 0.18, and a 1.5 mm ring field width that is capable of 50 nm resolution and 1.0 μm depth of focus. Table 7 below describes the mirror surfaces of the inventive optical system.

TABLE 5

| Element number | Radius of Curvature | Thickness | Element Definition |
|---|---|---|---|
| Object | Infinite | 351.141510 | Mask |

TABLE 5-continued

| Element number | Radius of Curvature | Thickness | Element Definition |
|---|---|---|---|
| 1 | A(1) | −292.381122 | M1 |
| 2 | A(2) | 504.794891 | M2 |
| 3 | A(3) | −496.445439 | M3 |
| 4 | A(4) | 193.582965 | M4 |
| 5 | A(5) | −260.692804 | M5 |
| Image | Infinite | | Wafer |

Referring to Table 5, the radius of curvature refers to the radius of curvature of each optical element, and the thickness refers to the vertex-to-vertex thickness between the optical surfaces. For example, the thickness of the object is 351.14151 mm and represents distance from the mask to the vertex of mirror M1. The aspheric parameters A(1)–A(5) for the optical elements M1, M2, M4, and M5 are set forth in Table 6. Table 7 gives first order data on a preferred embodiment.

TABLE 6

| Aspheric | CURV | K | A | B | C | D |
|---|---|---|---|---|---|---|
| A(1) | −0.00078289 | 1.62611100 | 0.00 | 3.498200E-16 | −7.101160E-22 | 0.00 |
| A(2) | −0.00239444 | 0.33946500 | 0.00 | 5.759030E-15 | 9.512560E-20 | 0.00 |
| A(3) | −0.00132043 | 0.02617400 | 0.00 | 1.143970E-17 | 7.746320E-23 | 0.00 |
| A(4) | −0.00223166 | 2.59276100 | 0.00 | −9.009250E-15 | −2.722770E-19 | 0.00 |
| A(5) | −0.00255085 | 0.34659500 | 0.00 | −9.701720E-16 | −1.567560E-20 | 0.00 |

TABLE 7

| | |
|---|---|
| Center of ring field (mask, mm) | −211.O |
| Effective focal length (mm) | −1067.797 |
| Paraxial reduction ratio | 0.25 |
| Finite F/N$_0$ | 1/2.78 |
| Total track (mm) | 0.0 |

The aspheric profile of each mirror is uniquely determined by its K, A, B, C, and D values, such as given in Table 6. The sag of the aspheric surface (through 10th order) as a function of radial coordinate (h) given by Equation 1:

$$z = \frac{ch^2}{1 + \sqrt{1 - (1+k)c^2 h^2}} + Ah^4 + Bh^6 + Ch^8 + Dh^{10} \quad [1]$$

Wherein, h is the radial coordinate; c is the curvature of the surface (1/R); and A, B, C, and D are the 4th, 6th, 8th, and 10th order deformation coefficients, respectively. Mirrors M1, M2, M3, M4, and M5 are all oblate spheroids with 6th and 8th order polynomial deformations.

Figure 5:
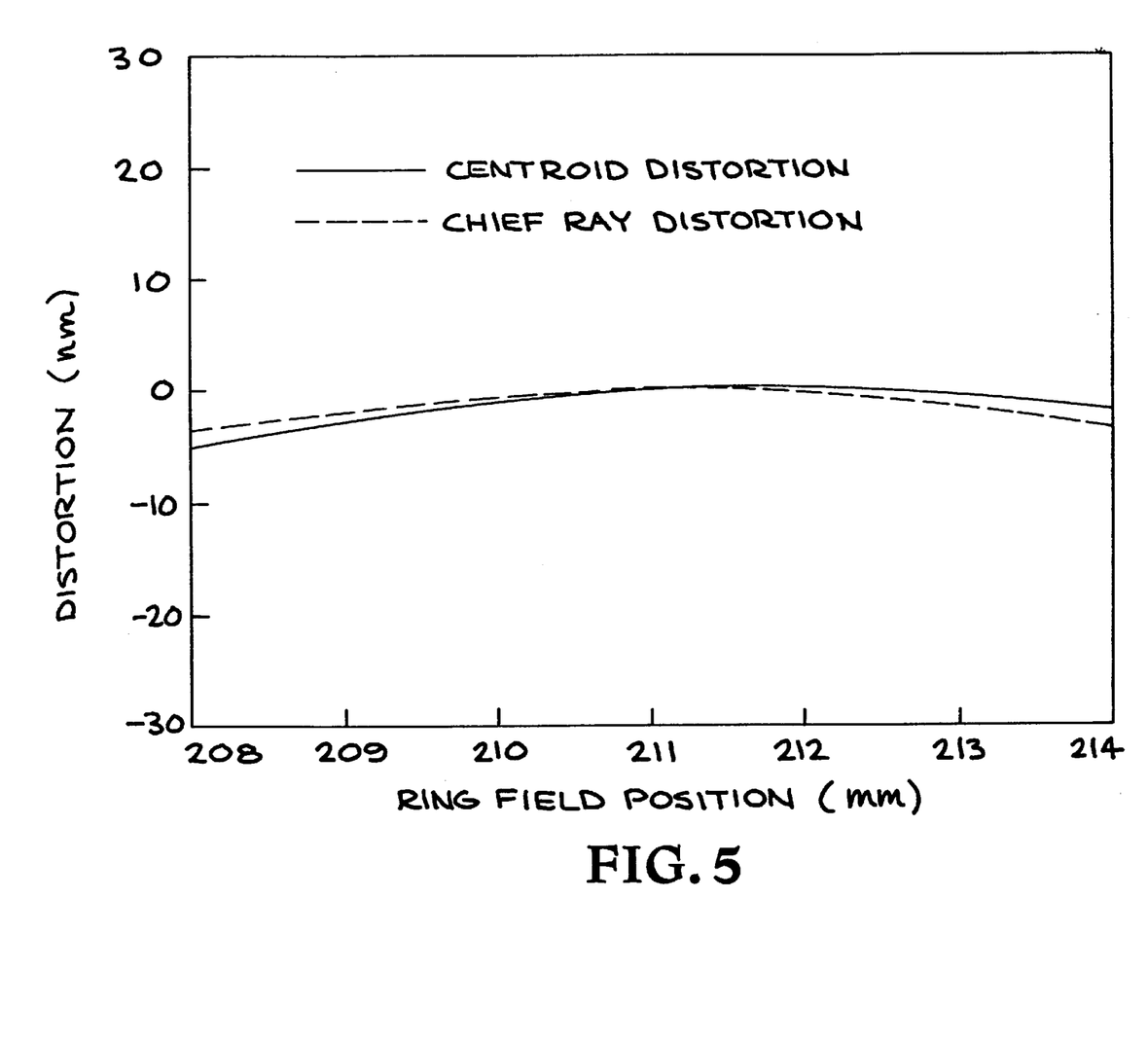
FIG. 5 is a graph showing distortion v. position across the ring field width.

Another advantage of the present invention is that the centroid distortion magnitude is balanced across the ring field width. This balanced distortion curve results in a minimization of dynamic (scanning) distortion. In scanning lithography, the mask and wafer are synchronously scanned so that the projected ring field at the mask will cover the entire wafer field. The scanning process has a substantial effect on the image aberrations, particularly distortion. The image distortion due to the relative movement of the image and the substrate during radiation exposure is dynamic distortion, which can smear an image out along a field dependent trajectory as the image crosses the ring field width.

Table 8 shows the performance of the system as described by the root mean square (RMS) wavefront error and corresponding Strehl ratio. Table 9 shows the deviation (distortion) of the image centroid at the wafer from its ideal location.

TABLE 8

| Ringfield Radius | RMS wavefront error | Strehl ratio |
|---|---|---|
| 52.000 mm | 0.015 | 0.991 |
| 52.375 mm | 0.007 | 0.998 |
| 52.750 mm | 0.011 | 0.996 |
| 53.125 mm | 0.009 | 0.996 |
| 53.500 mm | 0.013 | 0.993 |

TABLE 9

| Ideal image point (mm) | Chief ray distortion (nm) | Centroid distortion (nm) |
|---|---|---|
| −52.000 | −3.48 | −4.83 |
| −52.150 | −2.35 | −3.46 |
| −52.300 | −1.42 | −2.28 |
| −52.450 | −0.71 | −1.29 |
| −52.600 | −0.23 | −0.53 |
| −52.750 | 0.00 | 0.00 |
| −52.900 | −0.04 | 0.26 |
| −53.050 | 4).38 | 0.26 |
| −53.200 | −1.03 | −0.05 |
| −53.350 | −2.O1 | −0.67 |
| −53.500 | −3.34 | −1.63 |

Since the inventive optical projection system has an odd number of reflections, the mask and wafer are located of the same side of the imaging system. This introduces a limitation on the wafer travel. In the preferred configuration, the separation of the mask and wafer in the scan plane is 263.75 mm. The skilled artisan will readily appreciate that the entire optical system can be scaled by a constant greater than 1.0 to increase the separation between the mask and wafer. For example, the preferred configuration can be scaled by a factor of 1.5×, making the mask to wafer separation almost 400 mm. When the optical system is scaled, the chief ray angles (less than about 10°) remain the same, so that the multilayer coatings are unaffected. However, the distortion, wavefront error measured in waves, and the mirror asphericity scale with the scale factor. The limits imposed by mirror fabrication technology and the associated mirror metrology set a practical limit to the scale factor that can be used.

While the present invention has been described in terms of preferred embodiments above, those skilled in the art will readily appreciate that the present ring field optical system with such low distortion can be redesigned to accommodate a two-dimensional image format at a lower numerical aperture. Numerous modifications, substitutions and additions may be made to the disclosed embodiment without departing from the spirit and scope of the present invention. Although an optical system has been described above for use with a semiconductor photolithography system, those skilled in the art will readily appreciate that the inventive optical system may be utilized in any similar lithography device and that the present invention is in no way limited to the mechanisms described above. It is intended that all such modifications, substitutions and additions fall within the scope of the present invention which is best defined by the claims below.

I claim:

1. A scanning ringfield lithography apparatus for patterning images on a substrate, comprising:

a radiation source emitting extreme ultraviolet radiation of wavelengths ranging from approximately 4 to 20 nanometers;

a mask for generating patterned images onto the substrate; and reflective focusing optics positioned between the mask and the substrate, comprising five reflective elements which listed from mask to substrate are characterized as concave, convex, concave, convex, and concave, wherein the reflective focusing optics have a numerical aperture of greater than approximately 0.14.

2. The apparatus of claim 1, wherein at least four of the five reflective elements of the reflective focusing optics are rotationally symmetric aspheric surfaces.

3. The apparatus of claim 1, wherein at least four of the five reflective elements of the reflective focusing optics are elliptical surfaces.

4. The apparatus of claim 1, wherein the first reflective element deviates from the best fitting spherical surface by less than approximately 5.1 $\mu$m, the second reflective element deviates from the best fitting spherical surface by less than approximately 8.5 $\mu$m, the third reflective element deviates from the best fitting spherical surface by less than approximately 3.5 $\mu$m, the fourth reflective element deviates from the best fitting spherical surface by less than approximately 0.1 $\mu$m, and the fifth reflective element deviates from the best fitting spherical surface by less than approximately 18.8 $\mu$m.

5. The apparatus of claim 1, wherein the reflective optical elements are coaxial with respect to each other.

6. The apparatus of claim 1, wherein a beam of extreme ultraviolet radiation passes through the reflective focusing optics and is telecentric at the substrate plane.

7. The apparatus of claim 1, wherein the fourth reflective element provides an accessible aperture stop.

8. The apparatus of claim 1, wherein the reflective focusing optics project a focused image on the substrate in the shape of an arcuate slit having a width in a scanning direction of at least approximately 1.5 mm.

9. The apparatus of claim 1, wherein the mask is reflective and is positioned with the substrate on a first side of the reflective focusing optics.

10. The apparatus of claim 1, wherein a chief ray angle of radiation at the mask is less than approximately ten degrees.

11. The apparatus of claim 1, wherein the reflective focusing optics are characterized by a balanced static centroid distortion curve across the width of the arcuate slit.

* * * * *